(12) United States Patent
Sumi

(10) Patent No.: US 8,245,833 B2
(45) Date of Patent: Aug. 21, 2012

(54) SUBSTRATE TRANSPORT APPARATUS AND SUBSTRATE TRANSPORT METHOD

(75) Inventor: Hideki Sumi, Fukuoka (JP)

(73) Assignee: Panasonic Corporation, Osaka (JP)

( * ) Notice: Subject to any disclaimer, the term of this patent is extended or adjusted under 35 U.S.C. 154(b) by 276 days.

(21) Appl. No.: 12/739,585

(22) PCT Filed: Oct. 16, 2008

(86) PCT No.: PCT/JP2008/002936
§ 371 (c)(1),
(2), (4) Date: Apr. 23, 2010

(87) PCT Pub. No.: WO2009/054109
PCT Pub. Date: Apr. 30, 2009

(65) Prior Publication Data
US 2010/0262276 A1  Oct. 14, 2010

(30) Foreign Application Priority Data

Oct. 26, 2007 (JP) .................................. 2007-278559

(51) Int. Cl.
*H05K 13/04* (2006.01)

(52) U.S. Cl. ......... 198/341.01; 198/341.04; 198/341.05; 198/345.3; 198/463.3

(58) Field of Classification Search ............. 198/341.01, 198/341.04, 341.05, 345.3, 463.3, 465.3
See application file for complete search history.

(56) References Cited

U.S. PATENT DOCUMENTS

| | | | |
|---|---|---|---|
| 5,937,513 A | 8/1999 | Inutsuka et al. | |
| 6,219,897 B1 | 4/2001 | Inutsuka et al. | |
| 6,515,261 B1 * | 2/2003 | Smargiassi et al. | 219/390 |
| 6,918,176 B2 * | 7/2005 | Nagao et al. | 29/832 |
| 7,014,415 B2 * | 3/2006 | Yoshizawa | 414/797.5 |
| 7,750,818 B2 * | 7/2010 | Lee | 340/686.1 |
| 2001/0000366 A1 | 4/2001 | Inutsuka et al. | |

FOREIGN PATENT DOCUMENTS

| | | | | |
|---|---|---|---|---|
| JP | 61206717 A | * | 9/1986 | ............. 198/341.02 |
| JP | 1-146400 A | | 6/1989 | |
| JP | 8-236999 A | | 9/1996 | |
| JP | 9-172298 A | | 6/1997 | |
| JP | 11-274800 A | | 10/1999 | |
| JP | 2002305221 A | * | 10/2002 | |

OTHER PUBLICATIONS

International Search Report for PCT/JP2008/002936, Nov. 18, 2008.

* cited by examiner

*Primary Examiner* — Mark A Deuble
(74) *Attorney, Agent, or Firm* — Pearne & Gordon LLP

(57) ABSTRACT

To provide a substrate transport apparatus and a substrate transport method that enable curtailing of a mounting wait time incidental to movement of support pins.
Height data pertaining to components 10 mounted on a back side of a substrate 1 are stored beforehand. During substrate carrying-in operation, support pins 7 are caused to descend according to component height data and wait at a height h1 where to be able to avoid interference with the components 10. During substrate carrying-out operation, the support pins 7 are caused to descend according to the component height data and recede to the height h1 where to be able to avoid interference with the components 10.

8 Claims, 3 Drawing Sheets

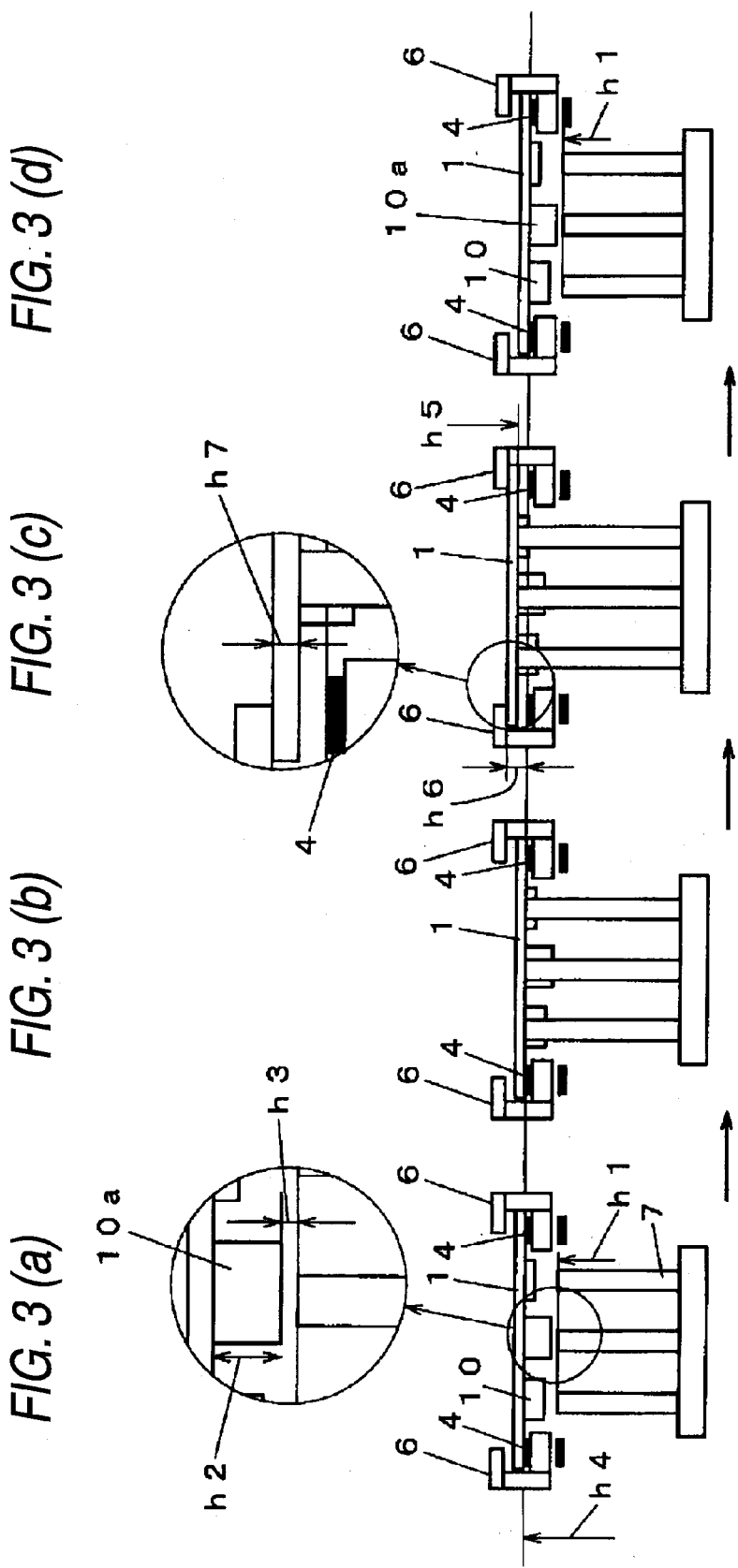

SUBSTRATE TRANSPORT APPARATUS AND SUBSTRATE TRANSPORT METHOD

TECHNICAL FIELD

The present invention relates to a substrate transport apparatus equipped with support pins for supporting a substrate from behind, as well as to a substrate transport method.

BACKGROUND ART

When components are mounted on a substrate transported along a transport path, the substrate is raised from behind by means of support pins positioned along the transport path, and front sides of both ends of the substrate are fixedly pressed against transport rails making up a transport path. The substrate is thereby supported at a predetermined height, and components are mounted on the front side of the substrate. After the components have been mounted, the support pins are once caused to recede in a downward direction from a back side of the substrate. The substrate released from a fixed state is transported to the next process, and a new substrate is carried into the transport path. The thus-receded support pins are again raised, to thus support the new substrate (see Patent Document 1).
Patent Document 1: JP-A-1-146400

DISCLOSURE OF THE INVENTION

Problem that the Invention is to solve

High-density packing for densely mounting a plurality of components on a unit substrate has recently become mainstream, and components have become frequently mounted on both sides of the substrate. When a substrate with components being already mounted on its back side is transported, the support pins must recede to a height where to be able to avoid interference with the components. However, if the heights of components are uncertain, the support pins must be caused to recede to a height spaced a sufficient distance apart from the back side of the substrate in order to avoid interference from the viewpoint of safety. As a result, a distance over which the support pins for supporting a newly-transported substrate move becomes longer. A period of time required for movement of the pins turns into a waiting time during which mounting is not carried out, which counts against production efficiency.

Accordingly, the present invention aims at providing a substrate transport apparatus and a substrate transport method that enable lessening of a mount waiting time incidental to movement of support pints.

Means for Solving the Problem

A substrate transport apparatus of the present invention has a substrate transport unit that transports a substrate along a transport path, a support pin that supports the substrate from behind, a support pin lift unit that lets the support pin ascend and descend, and a component height data storage unit for storing a height of a component mounted on a back side of the substrate, wherein the support pin is caused to ascend during mounting operation, to thus support the substrate, and the support pin is caused to descend according to the component height data during substrate carrying-out operation, thereby letting the support pin recede to a height where to be able to avoid interference with the component mounted on the back side of the substrate.

Another substrate transport apparatus of the present invention has a substrate transport unit that transports a substrate along a transport path, a support pin that supports the substrate from behind, a support pin lift unit that lets the support pin ascend and descend, and a component height data storage unit for storing a height of a component mounted on a back side of the substrate, wherein the support pin is caused to descend according to the component height data during substrate carrying-in operation and wait at a height where to be able to avoid interference with the component mounted on the back side of the substrate, and the support pin is caused to ascend during mounting operation, to thus support the substrate.

A substrate transport method of the present invention is intended for a substrate transport apparatus comprising a substrate transport unit that transports a substrate along a transport path, a support pin that supports the substrate from behind, a support pin lift unit that lets the support pin ascend and descend, and a component height data storage unit for storing height of components mounted on a back side of the substrate, the method comprising letting the support pin ascend, to thus support the substrate, during mounting operation; and letting the support pin descend according to the component height data during substrate carrying-out operation and recede to a height where to be able to avoid interference with the component mounted on the back side of the substrate.

Another substrate transport method of the present invention is also intended for a substrate transport apparatus comprising a substrate transport unit that transports a substrate along a transport path, a support pin that supports the substrate from behind, a support pin lift unit that lets the support pin ascend and descend, and a component height data storage unit for storing a height of a component mounted on a back side of the substrate, the method comprising letting the support pin descend according to component height data and wait at a height where to be able to avoid interference with the component mounted on the back side of the substrate during substrate carrying-in operation, and letting the support pin ascend during mounting operation, to thus support the substrate.

Advantage of the Invention

According to the present invention, there is set a height of a support pin employed when the support pin is caused to wait at or recede to at a position below a substrate during operation for carrying in or out the substrate according to previously-stored height data pertaining to a component already mounted on the back side of the substrate that is to serve as a mounting target. Travel distance of the support pin becomes appropriate for the height of the component without involvement of wasteful movement. A mounting wait time incurred by a series of operation including substrate carrying-in operation, mounting operation, and substrate carrying-out operation, can be shortened.

BRIEF DESCRIPTION OF THE DRAWINGS

FIG. 3 It is a side view showing ascending and descending operations of a support pin of the embodiment of the present invention.

DESCRIPTIONS OF THE REFERENCE NUMERALS AND SYMBOLS

1 SUBSTRATE
4 BELT CONVEYOR
7 SUPPORT PIN
9 SUPPORT PIN LIFT
10 COMPONENT
21 STORAGE SECTION

BEST MODE FOR IMPLEMENTING THE INVENTION

Figure 1:
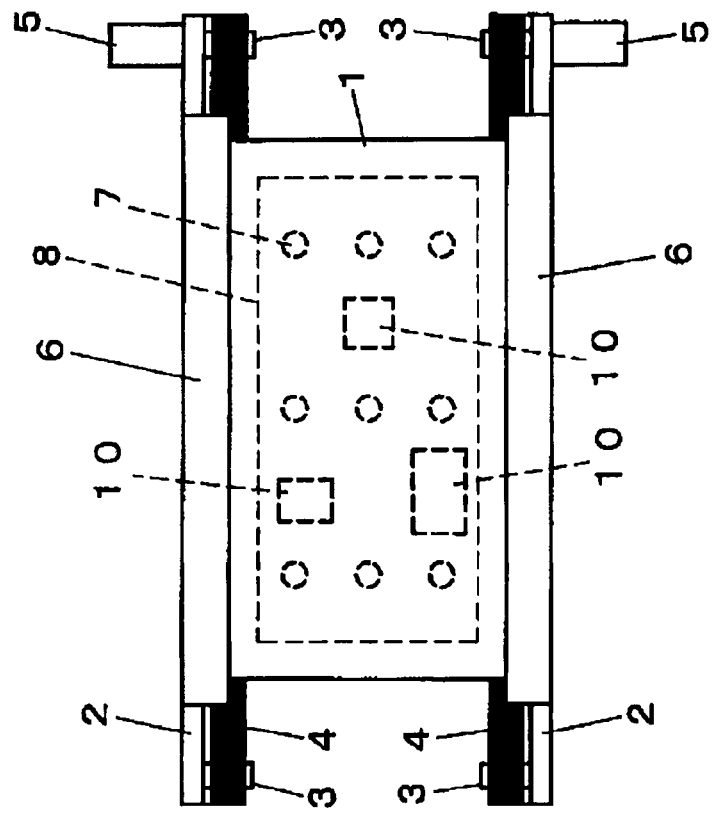
FIG. 1(a) It is a side view of a substrate transport apparatus of an embodiment of the present invention, and (b) it is a plan view of the same.
Figure 1:
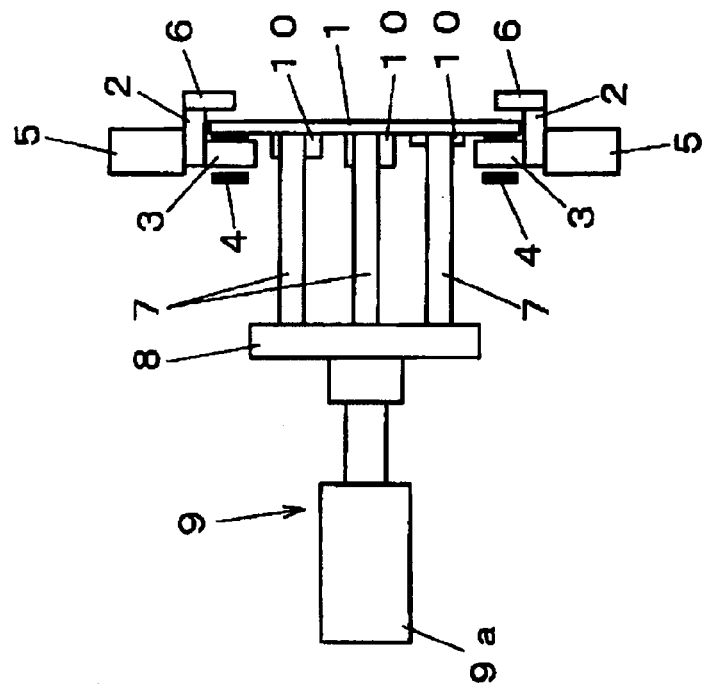
Figure 2:
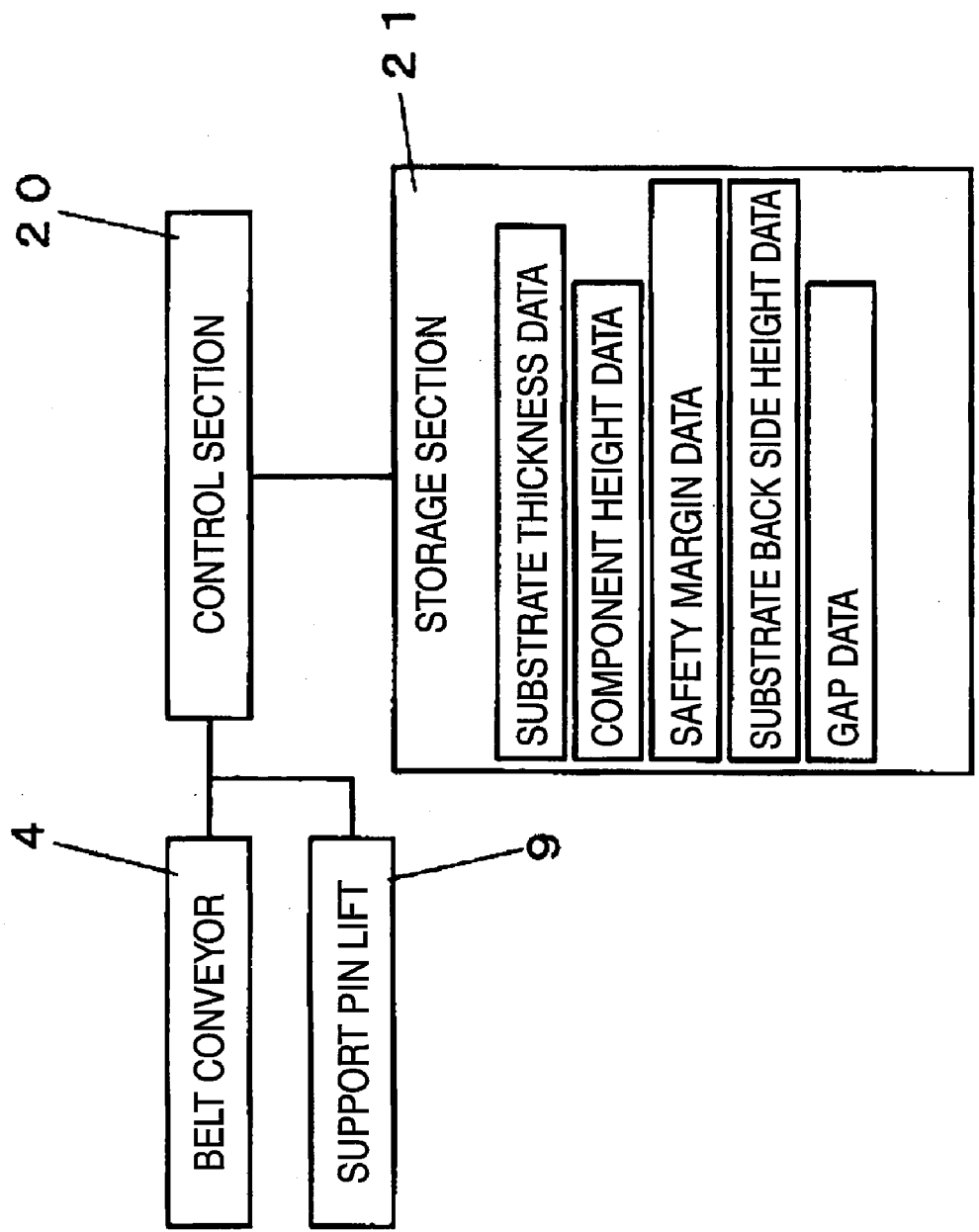
FIG. 2 It is a block diagram of a control system of the substrate transport apparatus of the embodiment of the present invention.

An embodiment of the present invention is now described by reference to the drawings. A structure of a substrate transport apparatus is first described by reference to FIGS. 1 and 2. The substrate transport apparatus is made up of a substrate transport guide for regulating the direction of transport of a substrate 1; a substrate transport unit that transports the substrate 1 along the transport guide; a support pin lift unit that lets the support pints 7 for supporting the substrate 1 from behind ascend or descend; a storage unit for storing height data pertaining to components mounted on a back side of the substrate 1; and a control unit for controlling the support pin lift unit.

The substrate transport guide is formed by horizontally extending a pair of plate-like members 2 whose height is greater than the thickness of the substrate 1 while maintaining the members in parallel to each other in the horizontal direction, whereby a transport path for the substrate 1 is formed between the pair of plate-like members. A belt conveyor 4 is horizontally passed around pulleys 3 fastened to a transport path side of a lower end of each of the plate-like members 2. The pulleys 3 are rotationally driven upon undergoing driving force from a motor 5, whereby the belt conveyor 4 is driven. The substrate 1 is placed in the substrate transport apparatus while both edges of the substrate are held on the pair of belt conveyors 4 making up a substrate transport unit and transported along the transport path as a result of the pair of belt conveyors 4 being synchronously driven.

A substrate press plate 6 jutting over a transport path is attached to an upper end of each of the plate-like members 2. The substrate press plates 6 are for coming into contact with both edges of the front side of the substrate 1 raised from the belt conveyors 4 by the substrate support unit, to thus press the substrate 1, and a gap that is larger than the thickness of the substrate 1 is formed between the substrate press plate 6 and the corresponding belt conveyor 4.

A plurality of support pins 7 are supported on a support pin holder 8. A plurality of insert holes (not shown) into which lower ends of the respective support pins 7 are to be inserted are bored in a predetermined array in the support pin holder 8 beforehand. In consideration of the shape and size of the substrate 1 and the positions of components 10 already mounted on the back side of the substrate 1, the support pin holder is configured so as to enable insertion of the support pints 7 in an array that makes it possible to support the substrate 1 in a well-balanced manner without contacting the components 10. A support pin lift 9 is a support pin lift unit having a built-in feed screw mechanism that employs a servo motor $9a$ as a drive source. The support pins 7 are let ascend or descend by means of driving force of the servo motor.

The control section 20 drives and controls a substrate transport apparatus according to varieties of sets of data stored in a storage section 21 in advance. The storage section 21 reserves substrate thickness data, component height data, safety margin data, substrate back height data, and gap data.

Operation for letting the support pins ascend or descend performed by the substrate transport apparatus is now described by reference to FIG. 3. FIG. 3($a$) shows the position of the support pins 7 achieved in a substrate carrying-in period during which the substrate 1 is carried in and along the transport path. The substrate 1 is carried in the path while its both edges are held on the respective belt conveyors 4. The support pints 7 wait for carrying-in of the substrate 1 with their tops maintained at height $h1$ where to be able to avoid interference with the components 10 already mounted on the back side of the substrate 1 that will be carried in. An interference avoidance height $h1$ is determined by adding a safety margin $h3$ to a height $h2$ of a component $10a$ having the maximum height, among the components 10 mounted on the back side of the substrate 1, and subtracting the result of addition from a substrate back side height $h4$. The support pins 7 thereby wait at a position below the substrate 1 while keeping a gap equivalent of at least the safety margin $h3$ with respect to the components 10 already mounted on the back side of the substrate 1. The substrate 1 is therefore transported to a position above the support pins 7 without involvement of occurrence of interference with the support pins 7.

FIG. 3($c$) shows the position of the support pins 7 achieved during mounting operation. The carried-in substrate 1 assumes a posture for enabling performance of mounting, as a result of ascending action of the support pins 7. As shown in FIG. 3($b$), when the support pins 7 have ascent to the substrate back side height $h4$, upper ends of the support pins 7 contact the back side of the substrate 1. The support pins 7 are arranged beforehand in consideration of positions where the components 10 are to be mounted, so as not to contact the components 10. When the support pins 7 further ascends in this state, the substrate 1 is raised by the support pins 7 as shown in FIG. 3($c$). Both edges of the front side of the substrate contact the substrate press plates 6, whereupon the substrate 1 is pressed from both sides by the support pins 7 and the substrate press plates 6, to thus become held stationary. Provided that the position of the support pins 7 achieved at this time is a substrate support height $h5$, the substrate support height $h5$ is determined by subtracting a substrate thickness $h7$ from the height (gap) $h6$ of clearance between the belt conveyor 4 and the substrate press plate 6 and adding the substrate back side height $h4$ to a result of subtraction.

FIG. 3($d$) shows the position of the support pins 7 achieved in substrate carrying-out operation during which the substrate 1 is carried outside and along the transport path. The substrate 1 having finished undergoing mounting enters a state in which both edges of the substrate are held on the belt conveyors 4, as a result of descending action of the support pins 7. During substrate carrying-out operation, the support pins 7 descend to the interference avoidance height $h1$. The support pins 7 thereby recede to a position below the substrate 1 with clearance appropriate of at least the safety margin $h3$ with respect to the components 10 already mounted on the back side of the substrate 1. The substrate 1 is thereby carried out without involvement of occurrence of interference with the support pins 7.

During foregoing operation of the substrate transport apparatus, the control section 20 calculates the interference avoidance height $h1$ and the substrate support height $h5$ from the respective types of data stored in the storage section. The support pins 7 are positioned by driving control of the support pin lift 9 according to data pertaining to these heights. Driving of the belt conveyors 4 is controlled in synchronism with drive control of the support pin lift 9. During substrate carrying-in operation, the substrate 1 is carried in the path at timing when the support pins 7 reach the interference avoidance height h1. During substrate carrying-out operation, the substrate 1 is carried outside at timing when the support pins 7 reach the interference avoidance height h1.

As mentioned above, the substrate transport apparatus of the embodiment reserves beforehand maximum height data pertaining to components already mounted on the back side of a substrate that is to serve as a mounting target. Therefore, height of support pins achieved when the support pins are held in a standby state or caused to recede to a position below the substrate during substrate carrying-in operation can be set while the height of the maximum component is taken as a reference. Accordingly, if height of components is uncertain, the support pins will remain receded to a height that is spaced a sufficient distance apart from the back side of the substrate so as to prevent occurrence of inference even when any heights of components are already mounted. Moreover, a distance over which the support pins must move in order to support a substrate which will be newly carried in also becomes longer. A period of time required for movement of the pins turns into a waiting time during which mounting is not carried out, which counts against production efficiency. The substrate transport apparatus of the present embodiment, on the contrary, makes it possible to adjust an interference avoidance height required during standby or receding operation in accordance with the height of already-mounted components. A mounting wait time incurred by a series of operation including substrate carrying-in operation, mounting operation, and substrate carrying-out operation can be shortened by setting an appropriate support pin interference avoidance height conforming to the heights of the components.

Although the embodiments of the present invention have been described thus far, the present invention is a mere matter disclosed by the embodiment. The present invention is also expected to be susceptible to modifications and applications of the present invention by those who are skilled in the art conceived on the basis of the descriptions of the present specification and the well-known techniques, and they shall also fall within a scope in which protection is sought.

The present invention is based on Japanese Patent Application filed on Oct. 26, 2007 (JP-A-2007-278559), contents of which are incorporated herein by reference.

INDUSTRIAL APPLICABILITY

According to the present invention, there is set height of support pins employed when the support pins are caused to wait at or recede to at a position below a substrate during operation for carrying in or out the substrate according to previously-stored height data pertaining to components already mounted on the back side of the substrate that is to serve as a mounting target. Travel distance of the support pins becomes appropriate for the height of components without involvement of wasteful movement. There is yielded an advantage of the ability to shorten a mounting wait time incurred by a series of operation including substrate carrying-in operation, mounting operation, and substrate carrying-out operation. Thus, the present invention is useful for a field in which components are mounted on continually-transported substrates.

The invention claimed is:

1. A substrate transport apparatus comprising a substrate transport unit that transports a substrate along a transport path, a support pin that supports the substrate from below, a support pin lift unit that lets the support pin ascend and descend, a component height data storage unit for storing maximum height data of components mounted on a back side of the substrate, and a control unit for controlling the support pin lift unit based on the maximum height data of the components, wherein the support pin lift unit controlled by the control unit causes the support pin to ascend during mounting operation, to thus support the substrate, and causes the support pin to descend according to the maximum height data of the components during substrate carrying-out operation to a height where to be able to avoid interference with the components mounted on the back side of the substrate.

2. The substrate transport apparatus according to claim 1, wherein the control unit calculates an interference avoidance height and a substrate support height based on the maximum height data of the components and positions the support pin based on the interference avoidance height and the substrate support height.

3. A substrate transport apparatus comprising a substrate transport unit that transports a substrate along a transport path, a support pin that supports the substrate from below, a support pin lift unit that lets the support pin ascend and descend, a component height data storage unit for storing maximum height data of components mounted on a back side of the substrate, and a control unit for controlling the support pin lift unit based on the maximum height data of the components, wherein the support pin lift unit controlled by control unit causes the support pin to descend according to the maximum height data of the components during substrate carrying-in operation and wait at a height where to be able to avoid interference with the components mounted on the back side of the substrate, and causes the support pin to ascend during mounting operation, to thus support the substrate.

4. The substrate transport apparatus according to claim 3, wherein the control unit calculates an interference avoidance height and a substrate support height based on the maximum height data of the components and positions the support pin based on the interference avoidance height and the substrate support height.

5. A substrate transport method for use with a substrate transport apparatus comprising a substrate transport unit that transports a substrate along a transport path, support pins that support the substrate from below, a support pin lift unit that lets the support pins ascend and descend, a component height data storage unit for storing maximum height data of components mounted on a back side of the substrate, and a control unit for controlling the support pin lift unit based on the maximum height data of the components, the method comprising letting the support pins ascend by the support pin lift unit controlled by the control unit, to thus support the substrate, during mounting operation; and letting the support pins descend by the support pin lift unit controlled by the control unit according to the maximum height data of the components during substrate carrying-out operation to a height where to be able to avoid interference with the components mounted on the back side of the substrate.

6. The substrate transport method according to claim 5, further comprising calculating an interference avoidance height and a substrate support height based on the maximum height data of the components and positioning the support pin based on the interference avoidance height and the substrate support height.

7. A substrate transport method for use with a substrate transport apparatus comprising a substrate transport unit that transports a substrate along a transport path, support pins that support the substrate from below, a support pin lift unit that lets the support pins ascend and descend, a component height data storage unit for storing maximum height data of components mounted on a back side of the substrate, and a control unit for controlling the support pin lift unit based on the maximum height data of the components, the method comprising letting the support pins descend by the support pin lift unit controlled by the control unit according to the maximum height data of the components and wait at a height where to be able to avoid interference with the components mounted on the back side of the substrate during substrate carrying-in operation, and letting the support pins ascend by the support pin lift unit controlled by the control unit during mounting operation, to thus support the substrate.

8. The substrate transport method according to claim 7, further comprising calculating an interference avoidance height and a substrate support height based on the maximum height data of the components and positioning the support pin based on the interference avoidance height and the substrate support height.

* * * * *